United States Patent [19]

Muratsuka et al.

[11] 4,090,148

[45] May 16, 1978

[54] CIRCUIT PATTERN FOR A PROTECTION CIRCUIT OF A STEREO AMPLIFIER

[75] Inventors: Hiroshi Muratsuka; Yoshio Aida, both of Tokyo, Japan

[73] Assignee: Trio Kabushiki Kaisha, Tokyo, Japan

[21] Appl. No.: 802,526

[22] Filed: Jun. 1, 1977

[30] Foreign Application Priority Data

Jul. 16, 1976 Japan .................................. 51-84581

[51] Int. Cl.[2] ................................................ H03F 3/68

[52] U.S. Cl. .................................. 330/207 P; 330/51; 330/149; 330/298

[58] Field of Search ............... 330/51, 66, 149, 207 P, 330/298; 179/1 P, 15 AN; 328/162, 163; 325/475, 476

[56] References Cited

U.S. PATENT DOCUMENTS 3,898,532 8/1975 Frank ................................ 330/207 P

*Primary Examiner*—James B. Mullins
*Attorney, Agent, or Firm*—Gerald J. Ferguson, Jr.; Joseph J. Baker

[57] ABSTRACT

In a stereo amplifier protective device having at least two relay circuits per channel where each circuit includes a pair of contact points, the improvement of the contact points in a first one of the channels being so disposed with respect to one another that the signal current flowing through a first pair of the contact points in the first channel is in a direction substantially opposite to that flowing through a second pair of the contact points in the first channel to thereby enhance channel separation in the stereo amplifier.

3 Claims, 5 Drawing Figures

CIRCUIT PATTERN FOR A PROTECTION CIRCUIT OF A STEREO AMPLIFIER

BACKGROUND OF THE INVENTION

1. Field of the Invention

The invention relates to a relay circuit used as a protective circuit for a stereo signal amplifier.

2. Discussion of the Prior Art

Relay circuits commonly used as protective devices for stereo signal amplifiers conventionally consist of four circuits and two contact points, as shown in FIG. 1, for example.

A relay circuit such as the one shown in FIG. 1 connects two circuits in parallel for each of the channels, A and B, and uses a printed distribution board with a pattern which allows the signal current between the contact points of each circuit to flow in one direction.

Therefore, the electromagnetic induction voltage resulting from the signal current flowing at each point of the relay contacts and the resistance of the contact points leads to the occurrence of a minor voltage — that is, cross-talk, at the load terminals. Accordingly, the separation between channels A and B deteriorates, which is a disadvantage of this relay circuit.

SUMMARY OF THE INVENTION

The objective of the invention is to improve separation between the channels by reducing the cross-talk in the above-described relay circuit which is used as a protective device.

BRIEF DESCRIPTION OF THE DRAWING

FIG. 2(A) is a plan view of a printed pattern of the relay circuit and FIG. 2(B) is a diagram indicating the direction of the flow of the signal currents and FIG. 3(A) is a plan view indicating a second practical embodiment of a printed pattern of a relay circuit and FIG. 3(B) is a diagram indicating the direction of the signal currents.

DETAILED DESCRIPTION OF THE PREFERRED EMBODIMENTS

Practical embodiments of this invention are described below, with reference to FIGS. 2(A) and (B) and FIGS. 3(A) and (B).

Figure 2A:
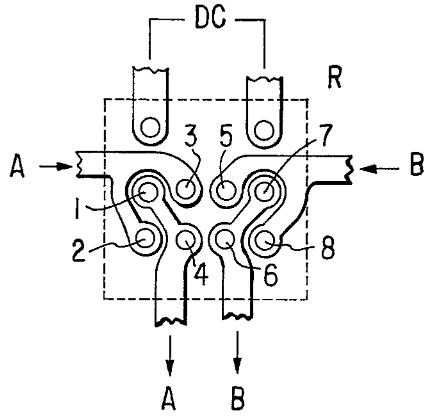
FIG. 2(A) and (B) and FIGS. 3(A) and (B) depict practical embodiments of the invention where
Figure 2B:
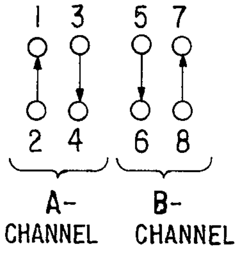
Figure 3A:
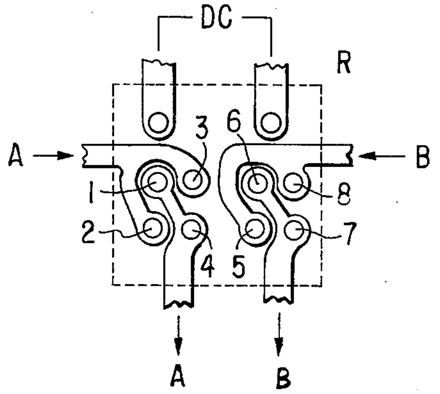

FIGS. 2(A) and (B) pertain to the invention and show and embodiment of a protective device for a stereo signal amplifier — that is, FIG. 2(A) is a plan indicating the pattern of a printed distribution board where four circuits and two contact points are used for the relay and FIG. 2(B) is a diagram indicating the direction of the signal current which flows between each of the contact points of the relay containing four circuits and two contact points.

When the arrangement is as shown in FIG. 2(A), the signal current flowing in Relay R becomes as shown in FIG. 2(B).

In short, the signal currents is channel A each flow ½ in opposite directions in Relay R — that is, from contact point 2 to point 1 and from contact point 3 to point 4. By this arrangement, the induction flux generated by the signal current flowing in Relay R will be extinguished by the interaction of the encountering currents and the induced voltage which influences channel B will be drastically reduced.

The explanation given for channel A also applies to the channel B side. That is, the signal current flows from contact point 5 to point 6 and from contact point 8 to about 7 and thus, the signal currents in this channel each flow ½ in the opposite direction. Thus the mutual action of the encountering signal currents extinguishes the induction flux generated by the signal currents, drastically curtailing the induced voltage which affects channel A.

Figure 1:
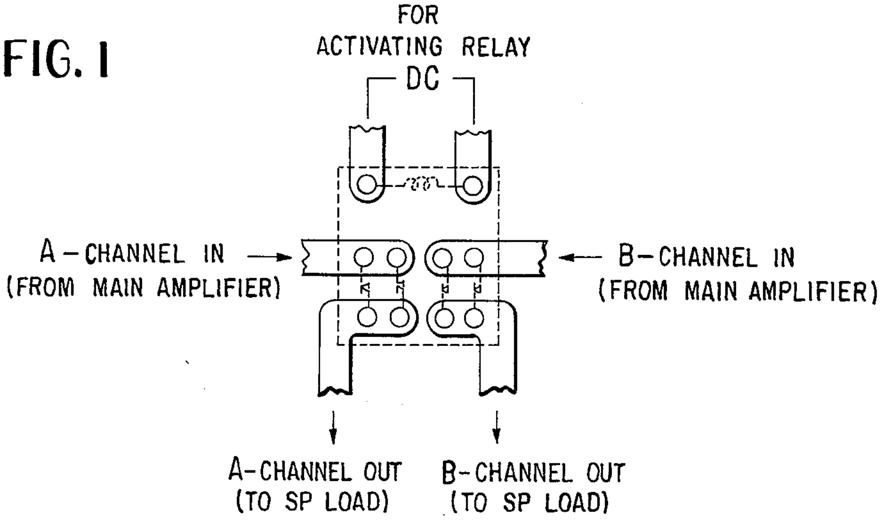
FIG. 1 is a plan view of a printed pattern of a relay circuit for a protective device conventionally used.

The embodiment of FIG. 2(A) and the conventional device shown in FIG. 1 were actually assembled in a stereo amplifier and tested to compare their performances. The result of the test revealed that the FIG. 2(A) embodiment improved the separation by 10-15 dB with a 20 kHz signal compared to the conventional device.

Figure 3B:
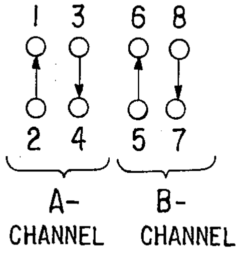

Next, a second practical embodiment of a protective device relating to this invention, shown in FIGS. 3(A) and (B), will be described. FIG. 3(A) is a plan indicating a pattern for a printed distribution board where four circuits and two contacts points are used in a relay and FIG. 3(B) is a diagram indicating the direction of each signal current flow between the relay points contact.

In the second practical embodiment of the invention, depicted in FIG. 3, the direction of the signal currents flowing between each of the contact points in each of channels A and B will be exactly the same as in the case of the Fig. 2 embodiment — that is, each current flows in a direction opposite to the other.

The point specifically different in this embodiment from the FIG. 2 embodiment is the direction of the signal currents flowing between the contact points which are side by side between channels A and B. As seen in FIG. 3(B), the signal currents flowing between adjacent contact points of channels A and B also flow in opposite directions. By this arrangement, the induction flux generated will be extinquished by the mutual action of the opposite currents further improving the separation between the two channels.

Consequently, by connecting the signal current shunted into at least two circuits per channel in a relay circuit designed to direct the shunted current to flow in opposite directions to one another, the protective device of this invention can extinquish the induction flux generated by the signal current and remarkably improve separation between the channels. Also, the above-described improvement can be implemented simply by altering the pattern of the printed distribution board. Thus, this invention is noted for its economical efficiency and remarkable achievement of clear separation between channels.

What is claimed is:

1. In a stereo amplifier protective device having at least two relay circuits per channel where each circuit includes a pair of contact points, the improvement of the contact points in a first one of the channels being so disposed with respect to one another that the signal current flowing through a first pair of the contact points in said first channel is in a direction substantially opposite to that flowing through a second pair of the contact points in said first channel to thereby enhance channel separation in the stereo amplifier.

2. In a stereo amplifier protective device as in Claim 1 where the contact points in a second one of the channels are so disposed with respect to one another that the signal current flowing through a third pair of the contact points in said second channel is in a direction substantially opposite to the flowing through a fourth pair of the contact points in said second channel.

3. In a stereo amplifier protective device as in Claim 2 where said second pair of contact points in said first channel and said third pair of contact points in said second channel are adjacent one another and so disposed that the signal current flowing through said second pair of contact points is in a direction substantially opposite to that flowing through said third pair of contact points to thereby further enhance said channel separation.

* * * * *